United States Patent [19]
Lamkin et al.

[11] Patent Number: 5,533,133
[45] Date of Patent: Jul. 2, 1996

[54] NOISE SUPPRESSION IN DIGITAL VOICE COMMUNICATIONS SYSTEMS

[75] Inventors: Allan Lamkin, Arlington, Va.; W. Robert Kepley, III, Gaithersburg, Md.; Prabhat K. Gupta, Germantown, Md.; Adrian J. Morris, Gaithersburg, Md.

[73] Assignee: Hughes Aircraft Company, Los Angeles, Calif.

[21] Appl. No.: 37,946

[22] Filed: Mar. 26, 1993

[51] Int. Cl.⁶ .................................................. H04B 15/00
[52] U.S. Cl. .................................................. 381/94; 381/46
[58] Field of Search .................................. 381/94, 37, 46, 381/47; 379/406, 392; 455/219, 222

[56] References Cited

U.S. PATENT DOCUMENTS 5,133,013  7/1992  Munday ..................................... 381/47
5,220,610  6/1993  Kane et al. ............................... 381/46

*Primary Examiner*—Curtis Kuntz
*Assistant Examiner*—Ping W. Lee
*Attorney, Agent, or Firm*—Phyllis Y. Price; Terje Gudmestad; Wanda K. Denson-Low

[57] ABSTRACT

Noise is suppressed during pauses and silent periods in conversation, and voiced signals are freely passed in a mobile communications system thereby improving the quality of the transmitted speech. Noise suppression is implemented in such a way that a low level of noise is still allowed to pass to provide presence of the remote speaker; that is, the line is not made completely silent as this may falsely indicate that the connection has been interrupted. The noise suppression has an added feature of decreasing the background noise fractionally when voice is no longer detected. This provides perceptually improved quality of the communication.

3 Claims, 3 Drawing Sheets

NOISE SUPPRESSION IN DIGITAL VOICE COMMUNICATIONS SYSTEMS

CROSS REFERENCE TO RELATED APPLICATION

The invention described herein is related in subject matter to that described in copending patent applications entitled "REAL-TIME IMPLEMENTATION OF A 8KBPS CELP CODER ON A DSP PAIR", Ser. No. 08/037,193 (Hughes Docket PD-N93007) by Prabhat K. Gupta, Walter R. Kepley III and Alan B. Lamkin, and "VOICE ACTIVITY DETECTOR FOR SPEECH SIGNALS IN A VARIABLE BACKGROUND NOISE", Ser. No. 08038,734 (Hughes Docket PD-N93006) by Prabhat K. Gupta, Walter R. Kepley III, Alan B. Lamkin, Adrian J. Morris, and Shrirang Jangi, both filed concurrently herewith and assigned to a common assignee. The disclosures of those applications are incoporated herein by reference.

DESCRIPTION

BACKGROUND OF THE INVENTION

1. Field of the Invention

The present invention generally relates to mobile digital communications systems such as air-to-ground and cellular communications systems and, more particularly, to a technique for (1) suppressing background noise when the speaker is not talking and (2) allowing speech signals to pass freely.

2. Description of the Prior Art

In mobile telephone applications such as cellular and air-to-ground telephony systems, background noise can be a hindrance to the conversation and its intelligibility. It is generally desirable to implement some form of noise suppression for the purpose of increasing the intelligibility of the mobile speaker's voice by allowing the person at the other end of the conversation to not to have to listen to a high audio level of background noise in pauses and silent periods of the conversation.

A voice activity detector (VAD) is used to detect speech for noise suppression. Accurate voice activity detection is important to permit reliable detection of speech in a noisy environment and therefore affects system performance and the quality of the received speech. Prior art VAD algorithms which analyze spectral properties of the signal suffer from high computational complexity. Simple VAD algorithms which look at short term time characteristics only in order to detect speech do not work well with high background noise.

There are basically two approaches to detecting voice activity. The first are pattern classifiers which use spectral characteristics that result in high computational complexity. An example of this approach uses five different measurements on the speech segment to be classified. The measured parameters are the zero-crossing rate, the speech energy, the correlation between adjacent speech samples, the first predictor coefficient from a 12-pole linear predictive coding (LPC) analysis, and the energy in the prediction error. This speech segment is assigned to a particular class (i.e., voiced speech, un-voiced speech, or silence) based on a minimum-distance rule obtained under the assumption that the measured parameters are distributed according to the multidimensional Gaussian probability density function.

The second approach examines the time domain characteristics of speech. An example of this approach implements an algorithm that uses a complementary arrangement of the level, envelope slope, and an automatic adaptive zero crossing rate detection feature to provide enhanced noise immunity during periods of high system noise.

SUMMARY OF THE INVENTION

It is therefore an object of the present invention to provide an improved technique for suppressing noise during pauses and silent periods in conversation yet freely passes speech signals in a mobile communications system thereby improving the quality of the transmitted speech.

According to the present invention, the noise suppression implemented is such that a low level of noise is still allowed to pass to provide presence of the remote speaker; that is, the line is not made completely silent as this may falsely indicate that the connection has been interrupted or lost. The algorithm implemented has an added feature of decreasing the background noise fractionally when speech is no longer detected. This provides perceptually improved quality of the communication.

The noise suppression of the invention is implemented with a voice activity detector (VAD) that implements a simple algorithm that is able to adapt to the background noise and detect speech with minimal clipping and false alarms. By using short term time domain parameters to discriminate between speech and silence, the invention is able to adapt to background noise. The preferred embodiment of the invention is implemented in a CELP coder that is partitioned into parallel tasks for real time implementation on dual digital signal processors (DSPs) with flexible inter-task communication, prioritization and synchronization with asynchronous transmit and receive frame timings. The two DSPs are used in a master-slave pair. Each DSP has its own local memory. The DSPs communicate with each other through interrupts. Messages are passed through a dual port RAM. Each dual port RAM has separate sections for command-response and for data. While both DSPs share the transmit functions, the slave DSP implements receive functions including echo cancellation, voice activity detection and noise suppression.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
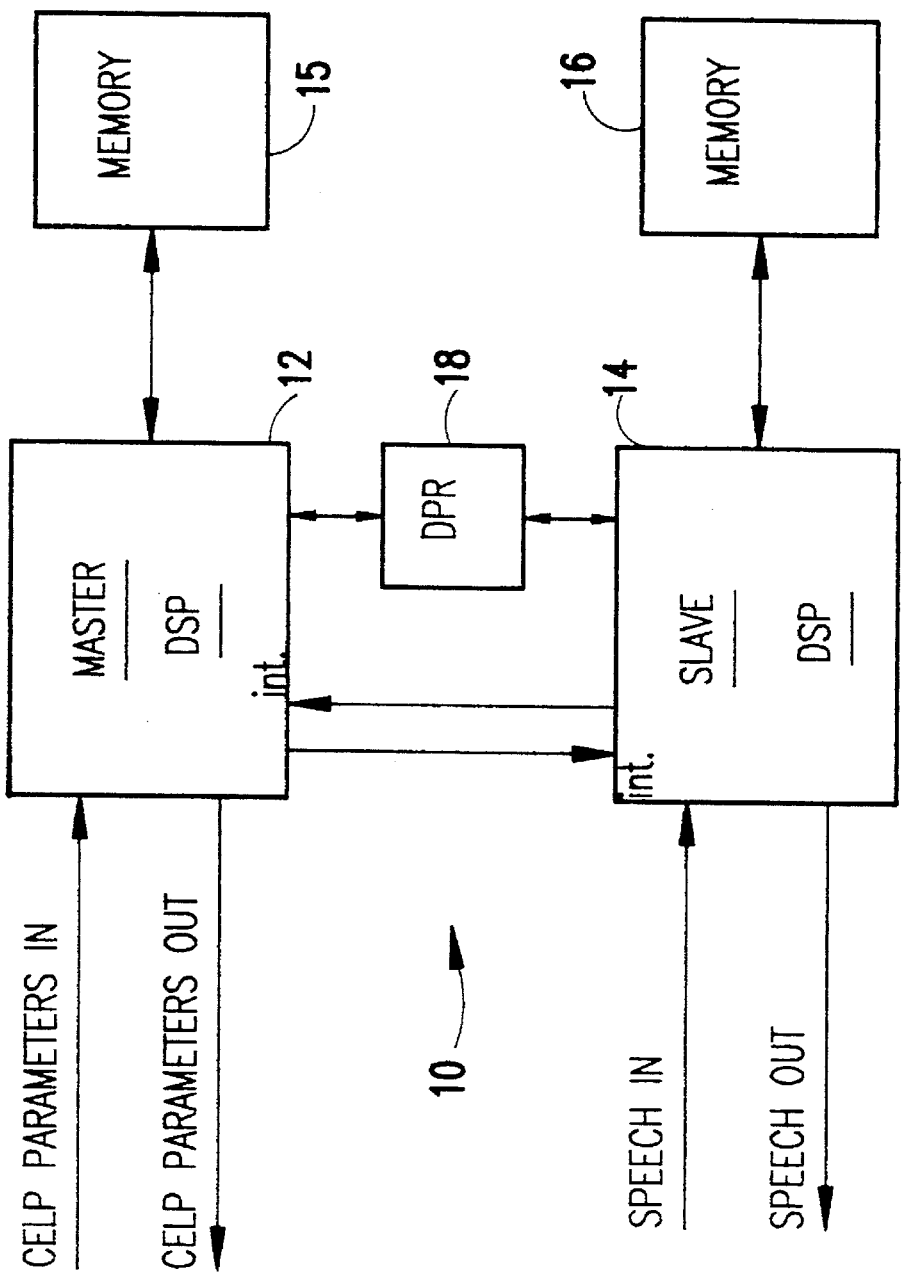
FIG. 1 is a block diagram showing the architecture of the CELP coder in which the present invention is implemented.

Referring now to the drawings, and more particularly to FIG. 1, there is shown a block diagram of the architecture of the CELP coder 10 which is the subject of application Ser. No. 08/037,193 (Hughes Docket PD-N93007) and on which the preferred embodiment of the invention is implemented. Two DSPs 12 and 14 are used in a master-slave pair; the DSP 12 is designated the master, and DSP 14 is the slave. Each DSP 12 and 14 has its own local memory 15 and 16, respectively. A suitable DSP for use as DSPs 12 and 14 is the Texas Instruments TMS320C31 DSP. The DSPs communicate to each other through interrupts. Messages are passed through a dual port RAM 18. Dual port RAM 18 has separate sections for command-response and for data.

The main computational burden for the speech coder is adaptive and stochastic code book searches on the transmitter and is shared between DSPs 12 and 14. DSP 12 implements the remaining encoder functions. All the speech decoder functions are implemented on DSP 14. Echo canceler and noise suppression are implemented on DSP 14 also.

The data flow through the DSPs is as follows for the transmit side. DSP 14 collects 20 ms of/x-law encoded samples and converts them to linear values. These samples are then echo canceled and passed on to DSP 12 through the dual port RAM 18. The LPC analysis is done in DSP 12. It then computes CELP vectors for each subframe and transfers it to DSP 14 over the dual port RAM 18. DSP 14 is then interrupted and assigned the task to compute the best index and gain for the second half of the codebook. DSP 12 computes the best index and gain for the first half of the codebook and chooses between the two based on the match score. DSP 12 also updates all the filter states at the end of each subframe and computes the speech parameters for transmission.

Synchronization is maintained by giving the transmit functions higher priority over receive functions. Since DSP 12 is the master, it preempts DSP 14 to maintain transmit timing. DSP 14 executes its task in the following order: (i) transmit processing, (ii) input buffering and echo cancellation, and (iii) receive processing and voice activity detector.

The loading of the DSPs is tabulated in Table 1.

TABLE 1

| Maximum Loading for 20 ms frames | | |
| --- | --- | --- |
| | DSP 12 | DSP 14 |
| Speech Transmit | 19 | 11 |
| Speech Receive | 0 | 4 |
| Echo Canceler | 0 | 3 |
| Noise Suppression | 0 | 3 |
| Total | 19 | 19 |
| Load | 95% | 95% |

It is the third (iii) priority of DSP 14 tasks to which the subject invention is directed, and more particularly to the task of noise suppression based on voice activity detection.

The voice activity is based on a voice activity algorithm and is determined on a group (i.e., frame) of thirty-two linear data samples at a time. Therefore, the samples will reach a maximum scaling after five frames or 20 ms. The maximum scaling is twenty-five percent (0.25) of the original signal or 12 dB. The steps are in increments of 0.15 of full scale. As soon as voice activity is detected, the voice is restored to full scale.

Figure 2:
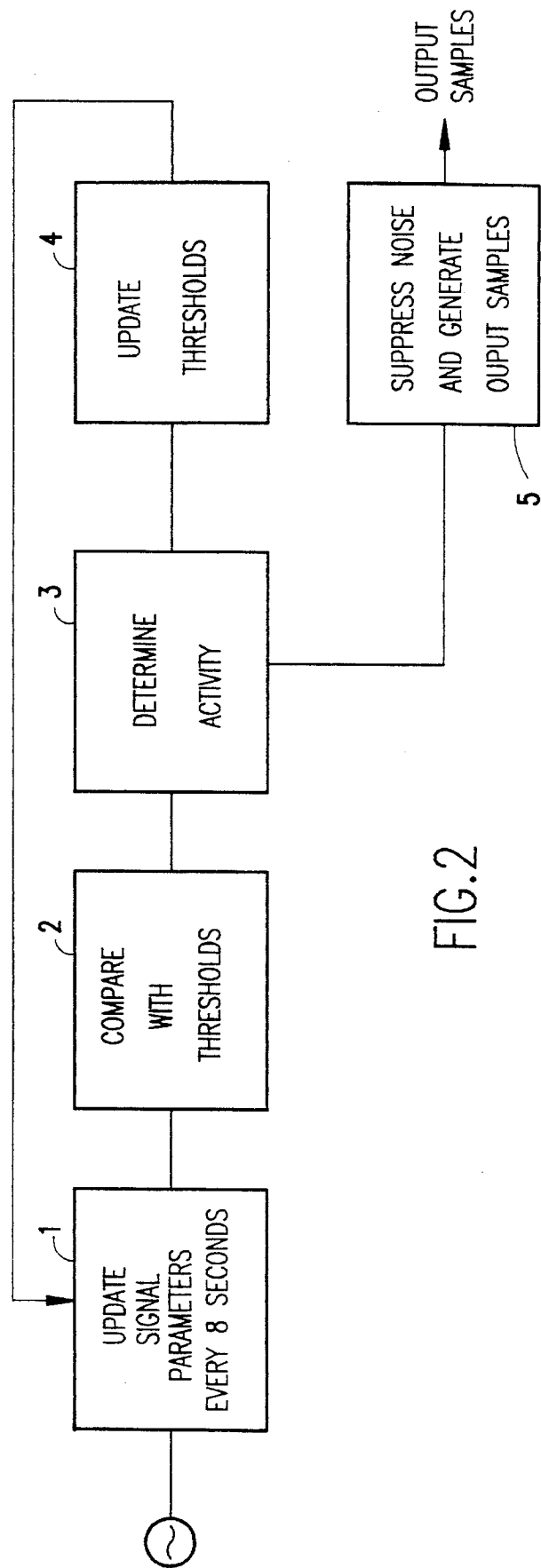
FIG. 2 is a functional block diagram showing the overall voice activity detection processes.

FIG. 2 is a functional block diagram of the implementation of voice activity detection and noise suppression processes in DSP 14 as disclosed in application Ser. No. 08/038,734 (Hughes Docket PD-N93006). The speech signal is input to block 1 where the signal parameters, including the average signal level, the zero crossing and the slope of the average signal level, are updated periodically, preferably every eight samples. The updated average signal level parameters are compared with high and low level thresholds, the updated zero crossing parameter is compared with a zero crossing threshold, and the updated slope parameter is compared with a slope threshold in block 2. The results of the comparisons are supplied to block 3 where voice activity is determined. Then the thresholds are updated in block 4. This is done by first detecting and updating a level of background noise, and if the absolute value of the difference between the background noise and the average signal level exceeds a predetermined value, updating the high and low level thresholds. A fast update of the low threshold is selected to ensure rapid tracking of the background noise if voice activity is not detected, but if voice activity is detected, a slow update of the low level threshold is selected. The high level threshold is set to a predetermined level above the low level threshold.

Figure 3:
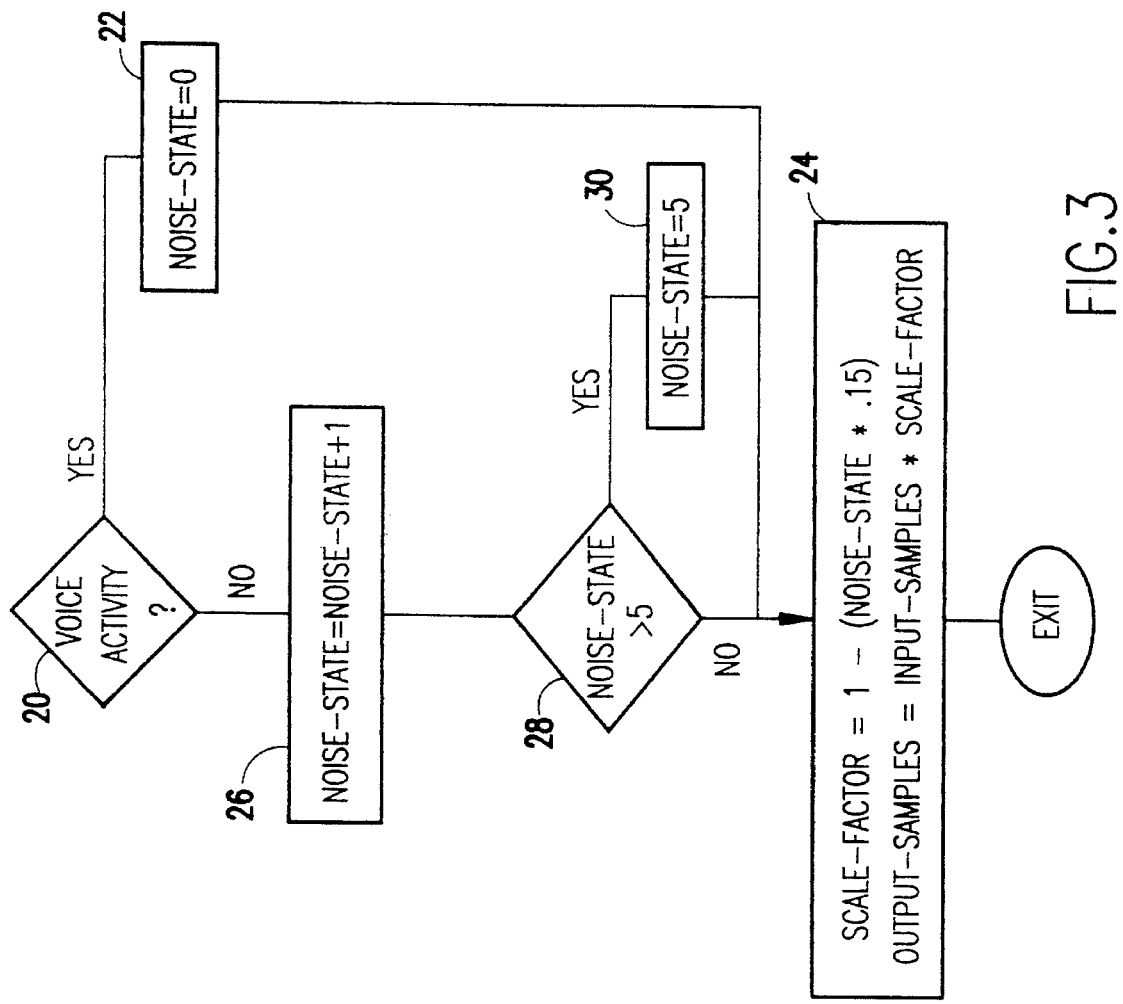
FIG. 3 is flow diagram showing the logic of the noise suppression algorithm implemented on the digital signal processor shown in FIG. 1.

The subject invention is specifically directed to noise suppression, and this is accomplished in block 5 which receives the output of the voice detection process of block 3 in FIG. 2. FIG. 3 is a flow diagram of the implementation of the noise suppression technique according to the invention. Again, this process is implemented in DSP 14 shown in FIG. 1. The process begins in decision block 20 where a decision is made as to the presence of voice activity based on the output of the process of block 3 in FIG. 2. The process uses a variable, the "noise state," to indicate the appropriate level of noise suppression. If voice activity exists, the noise state is set to zero in function block 22, and then the process goes to function block 24 before exiting. If voice activity does not exist based on the output of the process of block 3 in FIG. 2, then the noise state is incremented by one in function block 26 before testing the noise state to determine its level in decision block 28. If the noise state is greater than five, the noise state is set to five in function block 30 before going to function block 24. If the noise state is less than or equal to five, the process goes directly to function block 24. In function block 24, the scale factor is set to one minus the product of the noise state and 0.15 of full scale. The output samples are generated as the product of the input samples multiplied by the scale factor. Using this scale factor, noise suppression is implemented in such a way that a low level of noise is still allowed to pass to provide presence of the remote speaker. In this way, the line is not made completely silent to avoid falsely indicating that the connection has been interrupted or lost. This noise suppression technique has an added feature of decreasing the background noise fractionally when voice is no longer detected. This provides perceptually improved quality of the communication.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of noise suppression based on the detection of voice activity in a communications system comprising the steps of:

receiving voice signal samples and voice signal parameters including an average signal level, a zero crossing and a slope of the average signal level;

periodically updating the voice signal parameters;

comparing said updated average signal level parameters with high and low level thresholds, said updated zero crossing parameter with a zero crossing threshold, and said updated slope parameter with a slope threshold;

determining voice activity on said comparing step;

if voice activity exists, setting a noise state to zero, but if voice activity does not exist, then incrementing the noise state by one;

testing the noise state to determine its value and if the noise state is greater than a predetermined value, setting the noise state to said predetermined value;

setting a scale factor to one minus the product of the noise state and an attenuation constant; and generating output samples as a product of the input samples times the scale factor.

2. The method of noise suppression recited in claim 1 further comprising the steps of:

detecting and updating a level of background noise; and if the absolute value of the difference between said background noise and said update average signal level exceeds a predetermined value, updating said high and low level thresholds.

3. Apparatus for detecting voice activity and suppressing noise in a communications system comprising:

means for receiving voice signal samples and voice signal parameters including an average signal level, a zero crossing and a slope of the average signal level;

means for periodically updating the voice signal parameters;

means for comparing said updated average signal level parameters with high and low level thresholds, said updated zero crossing parameter with a zero crossing threshold, and said updated slope parameter with a slope threshold;

means for determining voice activity depending on said comparing step;

means for setting a noise state to zero if voice activity exists, but if voice activity does not exist, then for incrementing the noise state by one;

means for testing the noise state to determine its value and if the noise state is greater than a predetermined value, setting the noise state to said predetermined value;

means for setting a scale factor to one minus the product of the noise state and an attenuation constant.; and means for generating output samples as a product of the input samples and the scale factor.

* * * * *